(12) United States Patent
Ikeda et al.

(10) Patent No.: US 7,986,156 B2
(45) Date of Patent: Jul. 26, 2011

(54) SEMICONDUCTOR DEVICE INCLUDING ADDRESS SIGNAL GENERATING PROTION AND DIGITAL-TO-ANALOG CONVERTER

(75) Inventors: Jun Ikeda, Kanagawa (JP); Morihisa Hirata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 140 days.

(21) Appl. No.: 12/379,773

(22) Filed: Feb. 27, 2009

(65) Prior Publication Data

US 2009/0230987 A1    Sep. 17, 2009

(30) Foreign Application Priority Data

Mar. 17, 2008 (JP) ................. 2008-067309

(51) Int. Cl.
  *G01R 31/3187* (2006.01)
  *G01R 31/26* (2006.01)

(52) U.S. Cl. ........... 324/750.3; 324/762.01; 324/754.07; 365/201; 365/230.01; 714/733; 702/117

(58) Field of Classification Search .......... 324/763–765; 365/201, 230.01
  See application file for complete search history.

(56) References Cited

U.S. PATENT DOCUMENTS

| | | | | |
|---|---|---|---|---|
| 4,710,966 A * | 12/1987 | Aufiero | .......... | 382/325 |
| 6,472,898 B1 * | 10/2002 | Hollmer et al. | .......... | 324/765 |
| 7,315,267 B2 * | 1/2008 | Chung et al. | .......... | 341/110 |
| 2007/0133325 A1 * | 6/2007 | Kwon et al. | .......... | 365/201 |
| 2007/0183232 A1 * | 8/2007 | Okada | .......... | 365/201 |
| 2008/0191917 A1 * | 8/2008 | McClure et al. | .......... | 341/144 |

FOREIGN PATENT DOCUMENTS

JP  2001-44285   2/2001
JP  2007-103946  4/2007

OTHER PUBLICATIONS

K.Y.Y. Doong et al., "Field-Configurable Test Structure Array (FC-TSA): Enabling design for monitor model and manufacturability", Proc. IEEE 2006 ICMTS, 2006, p. 98-103.

S. Saxena et al., "Test Structures and Analysis Techniques for Estimation of the Impact of Layout on MOSFET Performance and Variability", Proc. IEEE 2004 ICMTS, 2004, p. 263-266.

J. Einfield et al., "A New Test Circuit for the Matching Characterization of npn Bipolar Transistors", Proc. IEEE 2004 ICMTS, 2004, p. 127-131.

* cited by examiner

*Primary Examiner* — Ha Tran T Nguyen
*Assistant Examiner* — Emily Y Chan
(74) *Attorney, Agent, or Firm* — McGinn IP Law Group, PLLC

(57) ABSTRACT

An exemplary aspect of an embodiment of the present invention is a semiconductor device including a plurality of test elements formed in an array on a semiconductor substrate, an address signal generating portion that generates an address signal corresponding to each of the test elements, and a digital-to-analog converter that converts the address signal into an analog signal and outputs the converted analog signal. The present invention enables to recognize which DUT is being measured.

15 Claims, 13 Drawing Sheets

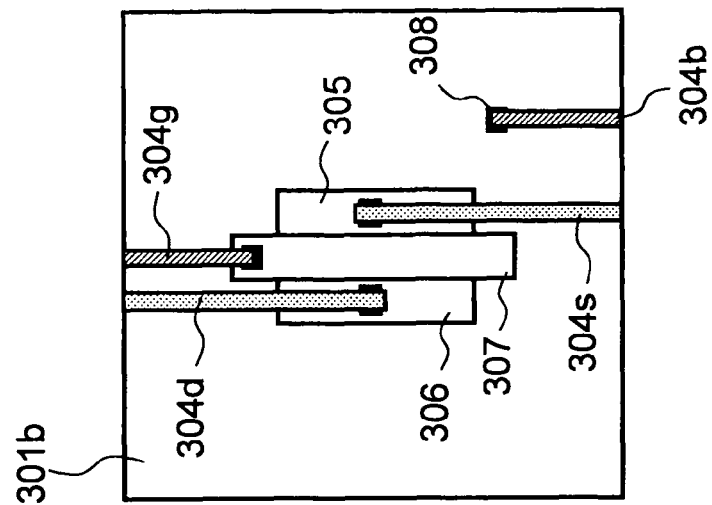
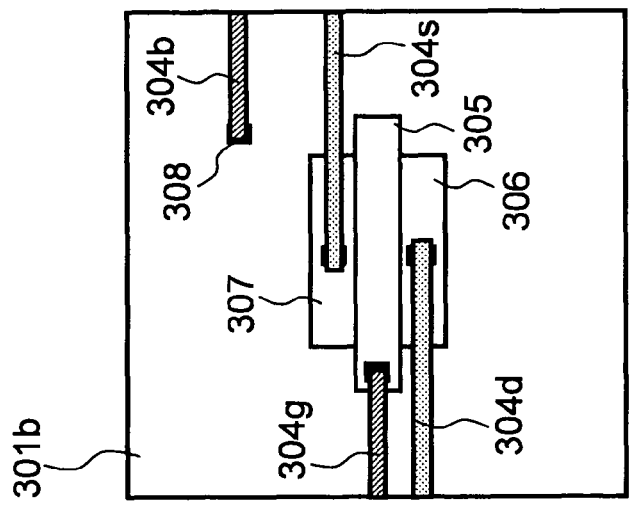
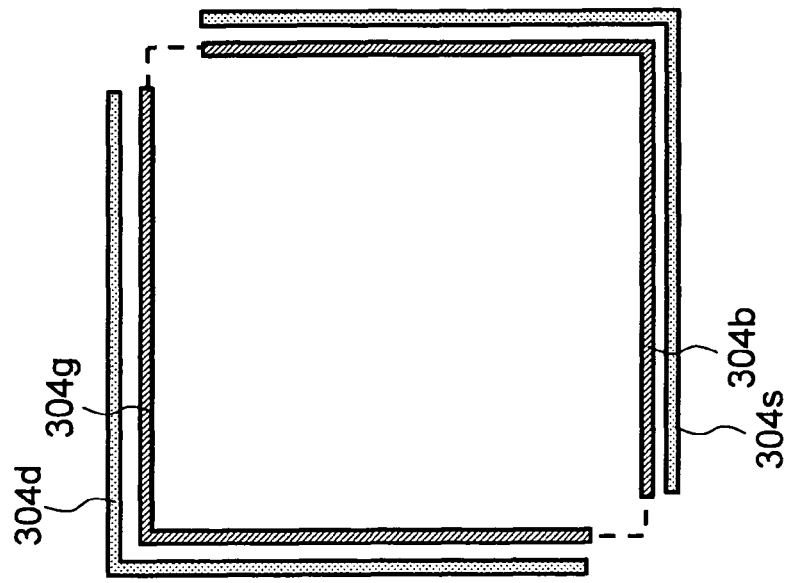
Fig. 7C
Fig. 7B
Fig. 7A

SEMICONDUCTOR DEVICE INCLUDING ADDRESS SIGNAL GENERATING PROTION AND DIGITAL-TO-ANALOG CONVERTER

BACKGROUND

1. Field of the Invention

The present invention relates to a semiconductor device, in particular a semiconductor device having a plurality of test elements formed in an array on a semiconductor substrate.

2. Description of Related Art

In resent manufacturing processes of semiconductor devices in which the downscaling has been advanced, variations in the electrical characteristics of components are large, and therefore it is necessary to accurately measure the variations in the electrical characteristics of the components in order to improve the yields. Therefore, a lot of devices to be tested (DUT: Device Under Test) are formed on a semiconductor wafer.

For example, Japanese Unexamined Patent Application Publication No. 2001-044285 discloses, in FIG. 9, a DUT to measure the electrical characteristics of transistors formed on a semiconductor wafer. This DUT requires pads for four terminals, i.e., for a gate, a source, a drain, and a substrate. That is, an area needed for one DUT is very large, and the number of DUTs mounted on a limited area is small. Therefore, it is impossible to perform a sufficient number of measurements to cope with the downscaling.

To solve this problem, K. Y. Y. Doong et al, "Field-Configurable Test Structure Array (FC-TSA): Enabling design for monitor, model and manufacturability", Proc. IEEE 2006 ICMTS, 2006, p. 98-103 discloses, in FIG. 1, a DUT array in which a lot of DUTs are arranged in an array to increase the mounting density of DUTs, and the target DUT to be measured are selectable. In this DUT array, an address is input in parallel, so that a lot of pads, i.e., the same number of pads as the number of the bits are required. Accordingly, S. Saxena et al., "Test Structures and Analysis Techniques for Estimation of the Impact of Layout on MOSFET Performance and Variability", Proc. IEEE 2004 ICMTS, 200, p. 263-266 discloses, in FIG. 1, a structure in which only the clock is input and an internal address is generated by the clock, so that the number of pads are reduced. Note that other techniques to which the present patent application relates to include Japanese Unexamined Patent Application Publication No. 2007-103946 and J. Einfeld et al., "A New Test Circuit for the Matching Characterization of npn Bipolar Transistors", Proc. IEEE 2004 ICMTS, 2004, p. 127-131.

FIG. 13 is a figure for illustrating a problem to be solved by the present invention. A semiconductor device shown in FIG. 13 includes an address signal generating portion 1, an X-switch 4, a Y-switch 5, and a DUT array 6. Similarly to Saxena, this semiconductor device generates an address signal from a clock signal CLK in the address signal generating portion 1. The X-switch 4 and the Y-switch 5 are controlled by this address signal so that a target DUT to be measured within the DUT array 6 can be designated.

SUMMARY

However, it has been impossible to recognize which DUT is actually being measured in the structure in FIG. 13. Therefore, it has been impossible, for example, to determine whether or not all the DUTs are properly tested in the DUT array 6, or to recognize which DUT exhibits the abnormal value or to recognize a similar situation. Furthermore, the DUT could be determined to be abnormal even when, for example, the abnormality is actually occurring in the address signal generating portion 1.

A first exemplary aspect of an embodiment of the present invention is a semiconductor device including: a plurality of test elements formed in an array on a semiconductor substrate; an address signal generating portion that generates an address signal corresponding to each of the test elements; and a digital-to-analog converter that converts the address signal into an analog signal and outputs the converted analog signal.

The present invention can provide a semiconductor device capable of recognizing which DUT is being measured.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 7A to 7C are schematic diagrams illustrating the layout of a DUT;

DETAILED DESCRIPTION OF THE EXEMPLARY EMBODIMENTS

First Exemplary Embodiment

Figure 1:
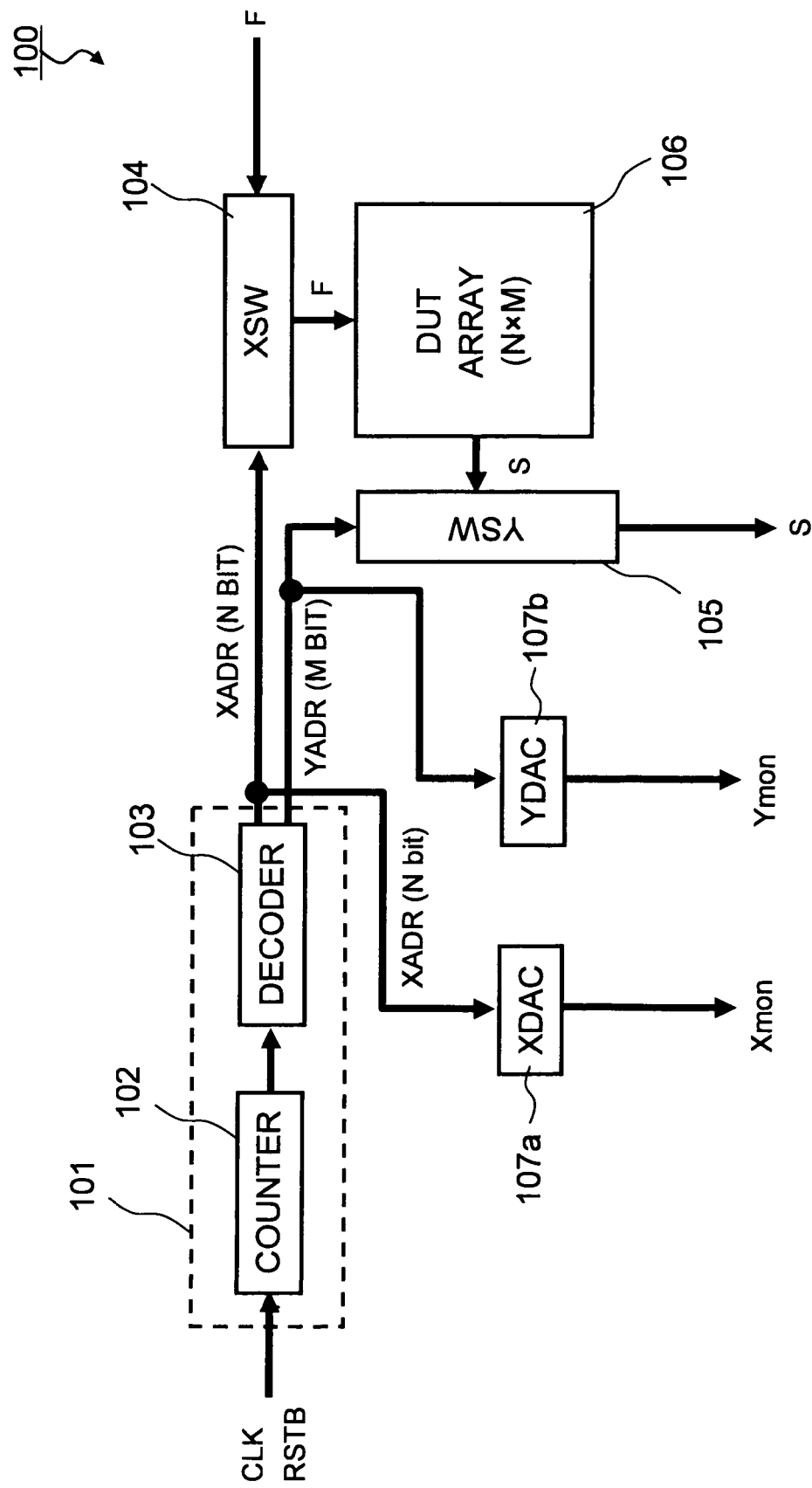
FIG. 1 is a block diagram of a TEG in a semiconductor device in accordance with an exemplary embodiment of the present invention.

Exemplary embodiments of the present invention are explained hereinafter with reference to the drawings. FIG. 1 is a block diagram of a semiconductor device in accordance with an exemplary embodiment of the present invention. As shown in FIG. 1, a semiconductor device in accordance with the exemplary embodiment has a TEG (Test Element Group) 100 including an address signal generating portion 101, a switch for X-address (XSW) 104, a switch for Y-address (YSW) 105, a DUT array 106, a DAC for X-address (XDAC) 107a, and a DAC for Y-address (YDAC) 107b.

Figure 2:
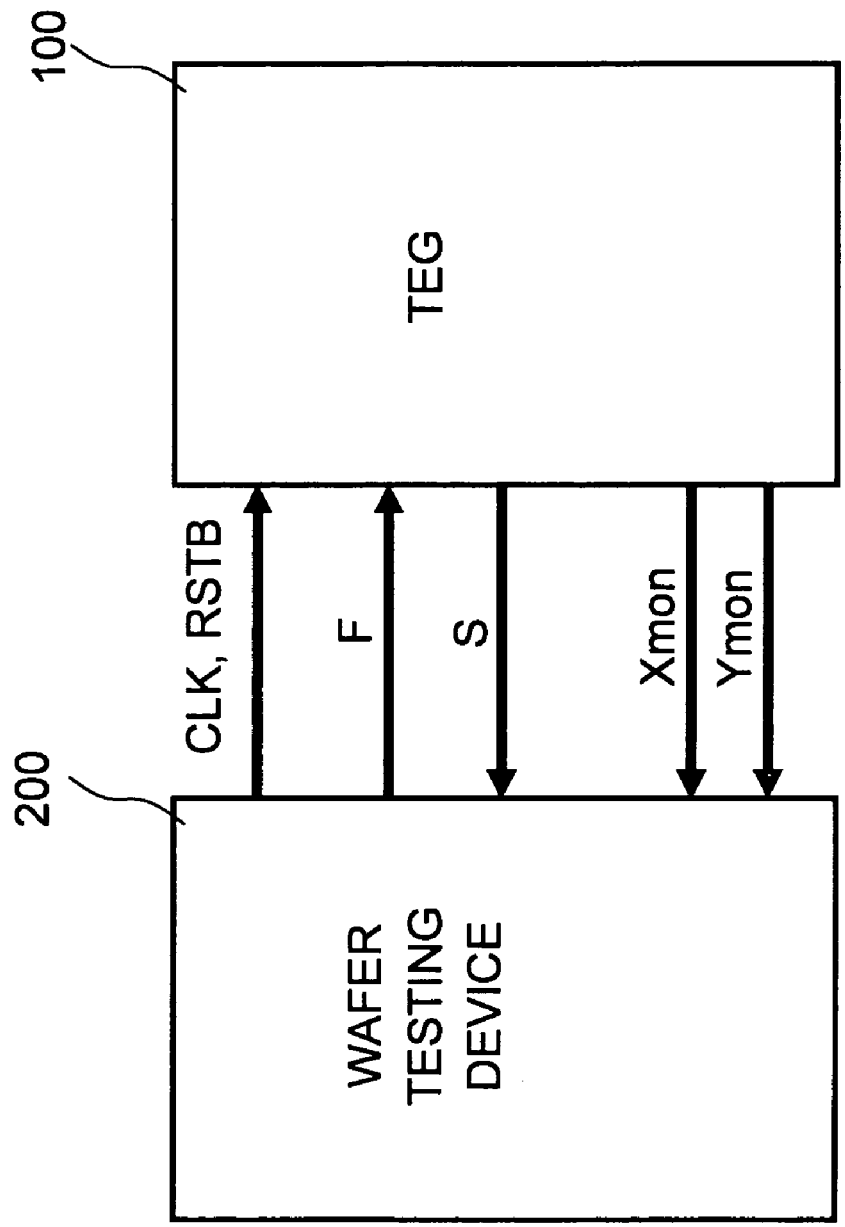
FIG. 2 is a block diagram illustrating the data input-output relation between a TEG and a wafer testing device.

The data input-output relation between a wafer testing device 200 that measures the analog characteristics of a DUT and the above-mentioned TEG 100 is explained hereinafter with reference to FIG. 2. As shown in FIG. 2, a clock signal CLK, a reset signal RSTB, and a force signal F are output from the wafer testing device 200 and input to the TEG 100. On the other hand, a sense signal S, an XDAC output signal XMON, and a YDAC output signal YMON are input from the TEG 100 to the wafer testing device 200. Note that other signals output from the wafer testing device 200 such as a back-bias signal and a mode select signal are omitted in this explanation. Note also that specific examples of the wafer testing device 200 include Ultra Advanced Parametric Tester 4073B and its option, i.e., Array Structure Parametric Test Option N9201A available from Agilent.

Next, the structure of the TEG 100 is explained hereinafter. The address signal generating portion 101 includes a counter (COUNTER) 102 and a decoder (DECODER) 103. The counter 102 generates a count value based on the clock signal CLK input from the wafer testing device 200. The decoder 103 is connected to the counter 102. Then, it generates an X-address signal XADR and a Y-address signal YADR based on the count value output from the counter 102.

The X-switch 104 is a switch to designate an X-coordinate, i.e., an address in the X-axis direction in the DUT array 106. Meanwhile, the Y-switch 105 is a switch to designate a Y-coordinate, i.e., an address in the Y-axis direction in the DUT array 106. The DUT array 106 includes NXM DUTs. Specifically, MOSFETs are arranged in N columns along the X-direction and M rows along the Y-direction as DUTs. Therefore, the X-switch 104 includes N switches corresponding to X-coordinates $X_1, X_2, \ldots X_{N-1}$, and $X_N$. Meanwhile, the Y-switch 105 includes M switches corresponding to Y-coordinates $Y_1, Y_2, \ldots Y_{M-1}$, and $Y_M$. The detailed structures of the X-switch 104, the Y-switch 105, and the DUT array 106 are explained later.

The DAC for X-address (XDAC) 107a is a digital-to-analog converter (DAC) to convert the X-address signal, which is a digital signal, into an analog signal. Similarly, the DAC for Y-address (YDAC) 107b is also a digital-to-analog converter (DAC) to convert the Y-address signal, which is a digital signal, into an analog signal.

Since the semiconductor device in accordance with the exemplary embodiment includes the DAC for X-address 107a and the DAC for Y-address 107b, it can recognize which DUT is being measured by the analog signals. Furthermore, it can also recognize an abnormality in the address signal generating portion 101. Note that since the wafer testing device 200 is to measure the analog characteristics of the DUT, the address signals, which are digital signals, need to be converted into analog signals so that the wafer testing device 200 can recognize the address.

Furthermore, since the DACs for the X-address and the Y-address are separately provided, it is possible to make each of the DACs smaller. Specifically, the DAC can be disposed, for example, between neighboring pads, so that it is unnecessary to secure a dedicated space for the DAC. Note that if a signal of (N+M) bits is to be processed by a single DAC, the DAC itself must be a larger one with high performance. Furthermore, the measuring device side also must have high performance since it is required to detect an analog signal of $2^{(N+M)}$ steps. By providing both the DAC for X-address 107a to process a signal of N bits and the DAC for Y-address 107b to process a signal of M bits as in the case of this exemplary embodiment, the above-mentioned problem can be avoided.

Note that since the TEG 100 in accordance with one aspect of the present invention includes the DUT array 106, it has relatively large area for a TEG. TEGs are often arranged in such a manner that several TEGs having different sizes are placed side by side. Therefore, it is preferable to make the longitudinal and transverse lengths of the TEG 100 in accordance with one aspect of the present invention equal to integral multiples of the longitudinal and transverse lengths of other smaller TEGs. In this way, it is possible to arrange the TEGs on the semiconductor wafer without leaving any space between them.

Next, the operation of the TEG 100 is explained hereinafter with reference to FIG. 1. A clock signal CLK and a reset signal RSTB output from the wafer testing device 200 are input to the counter 102. Specifically, the reset signal is input at the start of measurement, and the clock signal is also input in succession. The count value that is generated by the counter 102 based on the input clock signal CLK is input to the decoder 103. The decoder 103 generates an X-address signal XADR and a Y-address signal YADR based on the input count value. As described above, DUTs are arranged in N columns along the X-direction and M rows along the Y-direction. Therefore, the X-address signal XADR has N bits, and the Y-address signal YADR has M bits.

The X-switch 104 operates in response to the X-address signal XADR. Furthermore, the Y-switch 105 operates in response to the Y-address signal YADR. Specifically, among the X-switches that correspond to the X-coordinates $X_1, X_2, \ldots X_{N-1}$, and $X_N$, only one X-switch corresponding to one of these X-coordinates is turned on. Furthermore, among the Y-switches that correspond to the Y-coordinates $Y_1, Y_2, \ldots Y_{M-1, \text{ and } YM}$, only one Y-switch corresponding to one of these Y-coordinates is turned on. In this way, one DUT for which measurement is carried out is designated.

Meanwhile, the X-address signal XADR output from the decoder 103 is also input to the DAC for X-address 107a. At the DAC for X-address 107a, the N-bit digital signal is converted into $2^N$-step analog signal Xmon, and the converted signal is output. Then, the analog signal Xmon output from the DAC for X-address 107a is detected by the wafer testing device 200. Similarly, the Y-address signal YADR output from the decoder 103 is also input to the DAC for Y-address 107b. At the DAC for Y-address 107b, the M-bit digital signal is converted into a $2^M$-step analog signal Ymon, and the converted signal is output. Then, the analog signal Ymon output from the DAC for Y-address 107b is detected by the wafer testing device 200.

Furthermore, a force signal Foutput from the wafer testing device 200 is input to the DUT array 106 through the X-switch 104 as shown in FIG. 1. Meanwhile, a sense signal S is output from the DUT array 106 through the Y-switch 105. Then, the sense signal S is input to and detected by the wafer testing device 200.

Note that although there is one DUT array 106 in FIG. 1, it is also possible to test two or more DUT arrays 106 simultaneously by inputting the same address signal to the two or more DUT arrays 106.

Figure 3:
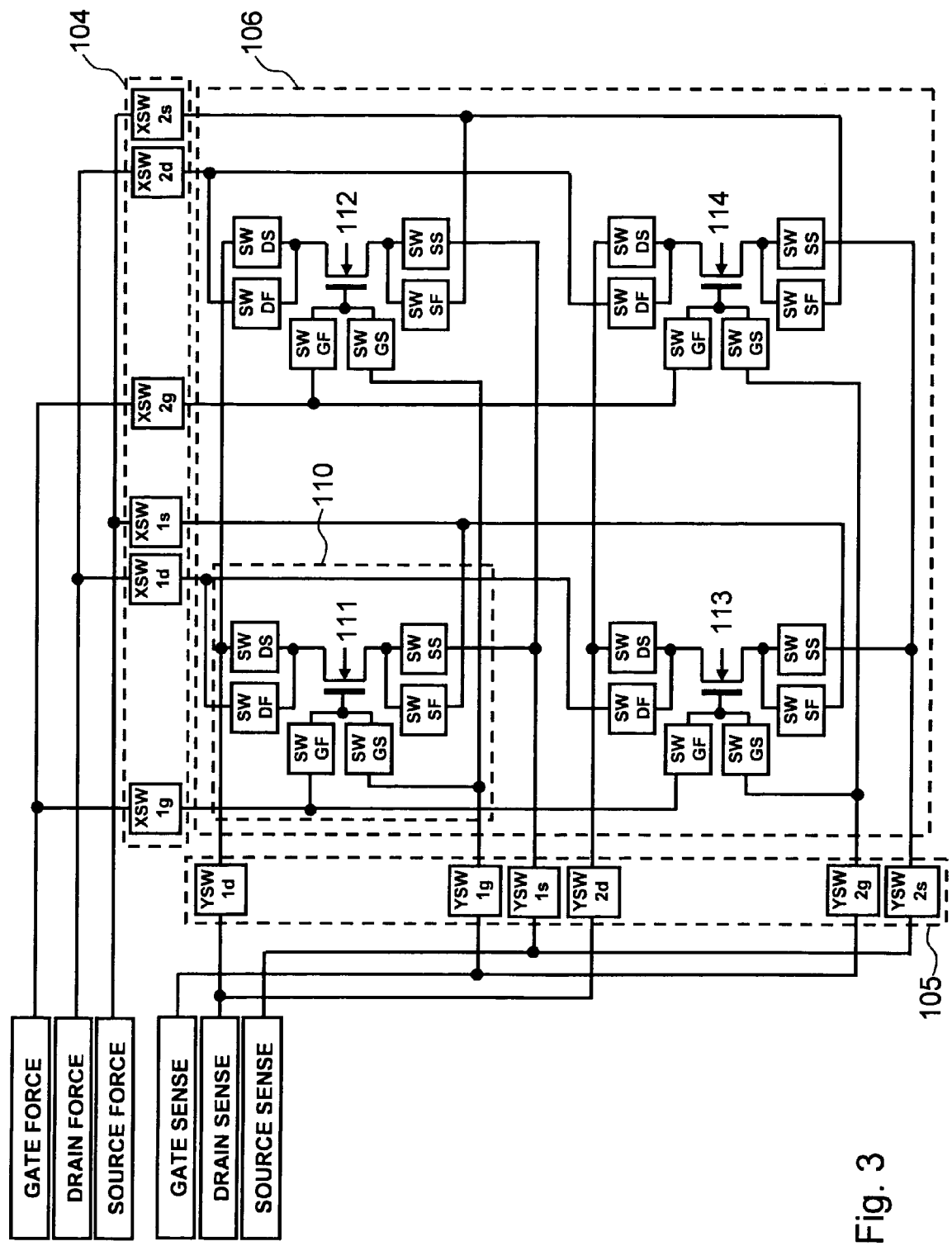
FIG. 3 is a circuit diagram illustrating details of a DUT array.

Next, the detailed structures of the X-switch 104, the Y-switch 105, and the DUT array 106 are explained hereinafter with reference to FIG. 3. For the sake of simplicity, the array of DUTs in the DUT array 106 is shown as N×M=2× 2=4 in FIG. 3. Specifically, the DUT array 106 in FIG. 3 is composed of four DUTs 111-114, all of which are NMOS transistors.

Note that an assumption is made for the sake of convenience that the DUT 111 is placed at the XY-coordinates (X,Y)=(1,1). Similarly, the DUT 112 is placed at the XY-coordinates (X,Y)=(2,1), the DUT 113 is placed at the XY-coordinates (X,Y)=(1,2), and the DUT 114 is placed at the XY-coordinates (X,Y)=(2,2). Note that, needless to say, the DUTs 111-114 may be PMOS transistors.

The X-switch 104 includes six switches, i.e., three switches XSW1g, XSW1d, and XSW1s corresponding to the X-coordinate X=1, and three switches XSW2g, XSW2d, and XSW2s corresponding to the X-coordinate X=2. That is, it includes two pairs of switches each for one X-coordinate, and each of the pairs includes three switches.

Furthermore, XSW1g and XSW2g are connected to Gate Force of the wafer testing device 200. XSW1d and XSW2d are connected to Drain Force of the wafer testing device 200. Furthermore, XSW1s and XSW2s are connected to Source Force of the wafer testing device 200.

The Y-switch 105 includes six switches, i.e., three switches YSW1g, YSW1d, and YSW1s corresponding to the Y-coordinate Y=1, and three switches YSW2g, YSW2d, and YSW2s corresponding to the Y-coordinate Y=2. That is, it includes two pairs of switches each for one Y-coordinate, and each of the pairs includes three switches.

Furthermore, YSW1g and YSW2g are connected to Gate Sence of the wafer testing device 200. YSW1d and YSW2d are connected to Drain Sense of the wafer testing device 200. Furthermore, YSW1s and YSW2s are connected to Source Sense of the wafer testing device 200.

Note that although it is not obvious from FIG. 3, the six switches constituting the X-switch 104 and the six switches constituting the Y-switch 105 are all NMOS transistors. However, PMOS transistors may be also used as a substitute.

Next, an attention is focused on the DUT 111. Six switches SWDF, SWDS, SWGF, SWGS, SWSF, and SWSS are arranged on the periphery of the DUT 111. Specifically, the switches SWDF and SWDS are connected in parallel to the drain of the DUT 111 which is a NMOS transistor. The switches SWGF and SWGS are connected in parallel to the gate of the DUT 111. Furthermore, the switches SWSF and SWSS are connected in parallel to the source of the DUT 111. Note that although it is not obvious from FIG. 3, the six switches SWDF, SWDS, SWGF, SWGS, SWSF, and SWSS are all NMOS transistors. However, PMOS transistors may be also used as a substitute.

The switch SWDF is connected to the Drain Force through the switch XSW1d. The switch SWDS is connected to the Drain Sense through the switch YSW1d. The switch SWGF is connected to the Gate Force through the switch XSW1g. The switch SWGS is connected to the Gate Sense through the switch YSW1g. The switch SWSF is connected to the Source Force through the switch XSW1s. The switch SWSS is connected to the Source Sense through the switch YSW1s.

Note that it is preferable to make the transistor sizes and the wiring resistances of the switches SWSF and SWSS connected to the source of the DUT 111 equal to those of the switches SWDF and SWDS connected to the drain. By using such a configuration, it is possible to carry out measurement in the state where the source and the drain of the DUT are replaced with each other.

The other DUTs 112-114 have similar configurations, and therefore explanation for them is omitted. In the following explanation, the DUT 111 and the six switches SWDF, SWDS, SWGF, SWGS, SWSF, and SWSS are collectively referred to as "DUT cell 110". The DUT array 106 in FIG. 3 is composed of four DUT cells 110.

Note that it is preferable to arrange each of the DUTs constituting the DUT array 106 at regular intervals both in the X-axis direction and the Y-axis direction. Furthermore, the DUT cell 110 preferably has a square-shape configuration.

With such a configuration, it is possible to accurately estimate the dependence of variations in the electrical characteristics on distance.

Next, the detailed operation is explained hereinafter with reference to FIGS. 1 and 3. In the following explanation, a case where the DUT 111 is the target DUT to be measured is explained. As shown in FIG. 1, when an X-address signal XADR is input to the X-switch 104 and the X-coordinate is designated as X=1, the three switches XSW1g, XSW1d, and XSW1s turn on. Furthermore, when a Y-address signal YADR is input to the Y-switch 105 and the Y-coordinate is designated as Y=1, the three switches YSW1g, YSW1d, and YSW1s turn on.

Note that the six switches SWDF, SWDS, SWGF, SWGS, SWSF, and SWSS are turned on by a logic circuit (not shown) when the X-coordinate X=1 and the Y-coordinate Y=1. That is, when the X-coordinate X=1 and the Y-coordinate Y=1, the six switches SWDF, SWDS, SWGF, SWGS, SWSF, and SWSS located on each peripheral portion of the DUTs 112-114 turn off.

A gate force signal is input from the Gate Force to the gate of the DUT 111 through the switches XSW1g and SWGF. Meanwhile, a gate sense signal is input to the Gate Sense through the switches SWGS and YSW1g.

A drain force signal is input from the Drain Force to the drain of the DUT 111 through the switches XSW1d and SWDF. Meanwhile, a drain sense signal is input to the Drain Sense through the switches SWDS and YSW1d.

A source force signal is input from the Source Force to the source of the DUT 111 through the switches XSW1s and SWSF. Meanwhile, a source sense signal is input to the Source Sense through the switches SWSS and YSW1s.

Figure 4:
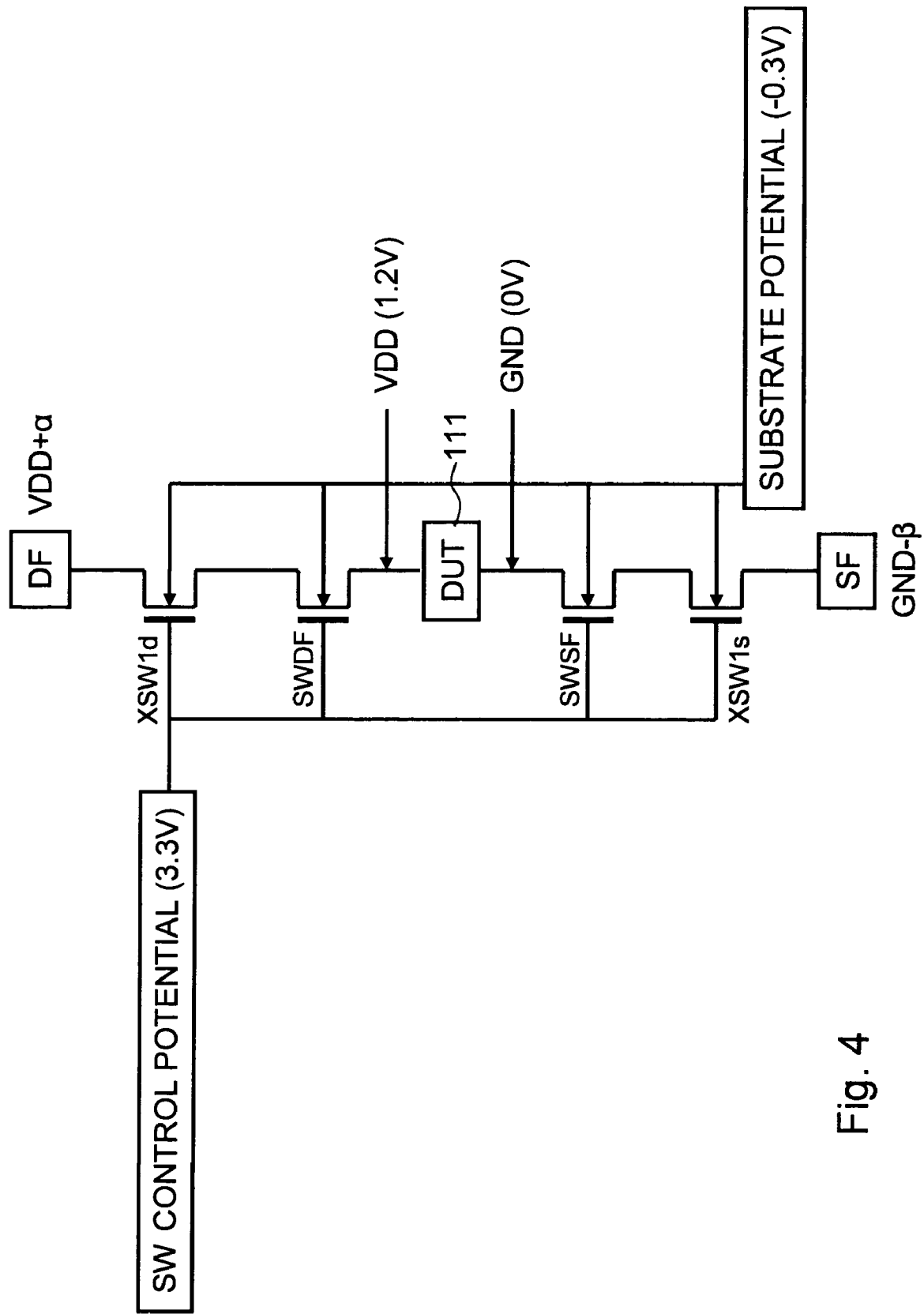
FIG. 4 is a circuit diagram for illustrating the control potential and the substrate potential of a switch on the periphery of a DUT.

Next, the control potential of the switches located on the periphery of the DUT is explained hereinafter with reference to FIG. 4. FIG. 4 shows a path from the Source Force to the Drain Force in the case where the DUT 111 is measured in FIG. 3. As shown in FIGS. 3 and 4, a drain force signal is input to the DUT 111 through the switches XSW1d and SWDF, both of which are NMOS transistors. Meanwhile, a source force signal is input to the DUT 111 through the switches XSW1s and SWSF, both of which are NMOS transistors.

Note that a ground potential GND (0V) and a power supply potential VDD (1.2V) need to be supplied to the source and the drain, respectively, of the DUT 111, which is a NMOS transistor, as shown in FIG. 4. Since a voltage drop occurs by the switches, a voltage higher than the VDD (i.e., VDD+α (1.2+αV)) needs to be supplied to the Drain Force. Furthermore, a voltage lower than the GND (i.e., GND-β (-βV)) needs to be supplied to the Source Force.

To prevent the malfunction of the switches, a potential that is supplied to the gates of the switches XSW1d and SWDF (SW control potential) needs to be higher than the VDD. Meanwhile, a potential that is supplied to the back gates of the switches XSW1s and SWSF (substrates potential) needs to be lower than the GND-β. In an exemplary embodiment of the present invention, the substrate potential is set to -0.3V and the SW control potential is set to 3.3V for all of the above-mentioned four switches XSW1d, SWDF, XSW1s, and SWSF. Needless to say, they are not limited to these values.

Figure 5:
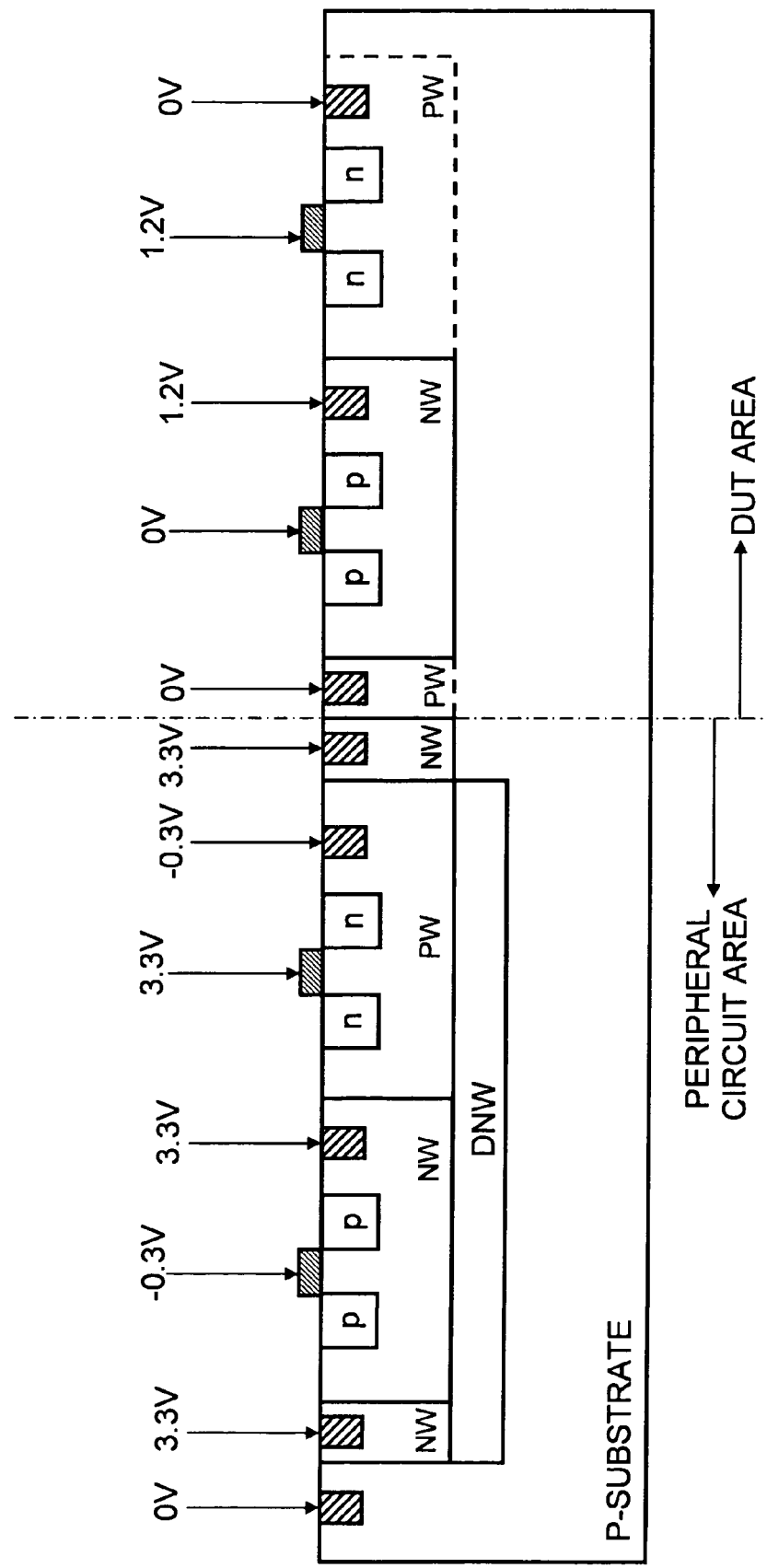
FIG. 5 is one example of a cross section of a substrate in which a deep N-well is formed.

Note that to bring the substrate potential of each switch to a negative potential, it is necessary to form a deep N-well on the P-substrate to isolate the substrate potential of the switch from the substrate potential of the DUT. FIG. 5 shows a cross section of a substrate in which a deep N-well is formed. As shown in FIG. 5, the deep N-well DNW is not formed in the DUT area, but is formed only in the peripheral circuit area of the DUT in an exemplary embodiment of the present invention. Note that the term "DUT area" means the DUTs 111-114 themselves shown in FIG. 3. In other words, the six switches SWDF, SWDS, SWGF, SWGS, SWSF, and SWSS located on the periphery of the DUT are not contained in the DUT area, but are contained in the peripheral circuit area.

In FIG. 5, the deep N-well DNW is formed in the peripheral circuit area on the P-substrate. The P-substrate is supplied with 0V, and the deep N-well DNW is supplied with 3.3V through an N-well NW and a tap in the N-well NW. Therefore, the P-substrate and the deep N-well DNW are reverse-biased. Furthermore, an N-well NW and a P-well PW are formed on the deep N-well DNW. This N-well NW is supplied with 3.3V through a tap. The P-well PW is supplied with −0.3V through a tap. A PMOS transistor is formed on the N-well NW. The gate of this PMOS transistor is supplied with −0.3V. A NMOS transistor is formed on the P-well PW. The gate of this NMOS transistor is supplied with 3.3V.

Meanwhile, no deep N-well DNW is formed on the DUT area. An N-well NW and a P-well PW are formed on the P-substrate. This N-well NW is supplied with 1.2V through a tap. The P-well PW is supplied with 0V through a tap. A PMOS transistor is formed on the N-well NW. The gate of this PMOS transistor is supplied with 0V. A NMOS transistor is formed on the P-well PW. The gate of this NMOS transistor is supplied with 1.2V.

As described above, the substrate potential of switches located on the periphery of a DUT can be brought to a negative potential by forming a deep N-well DNW in the DUT peripheral area. Furthermore, by forming the deep N-well DNW in the DUT peripheral area rather than in the DUT area, it is possible to eliminate the possibility that the deep N-well DNW affects on the characteristics of the DUT.

Note that although no PMOS transistor is shown in FIGS. 3 and 4, PMOS transistors are used in the logic circuit (not shown), and therefore an example of them is illustrated in the peripheral circuit area in FIG. 5. Furthermore, an example of a PMOS transistor is also illustrated in the DUT area together with the NMOS transistor shown in FIG. 3.

Figure 6B:
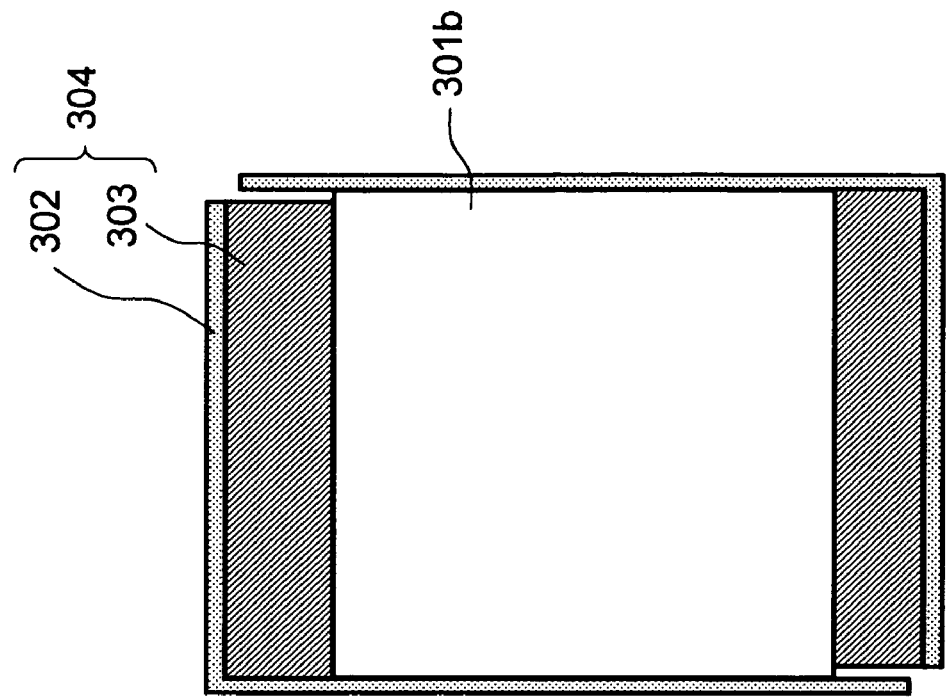
FIGS. 6A and 6B are schematic diagrams illustrating the layout of a DUT.
Figure 6A:
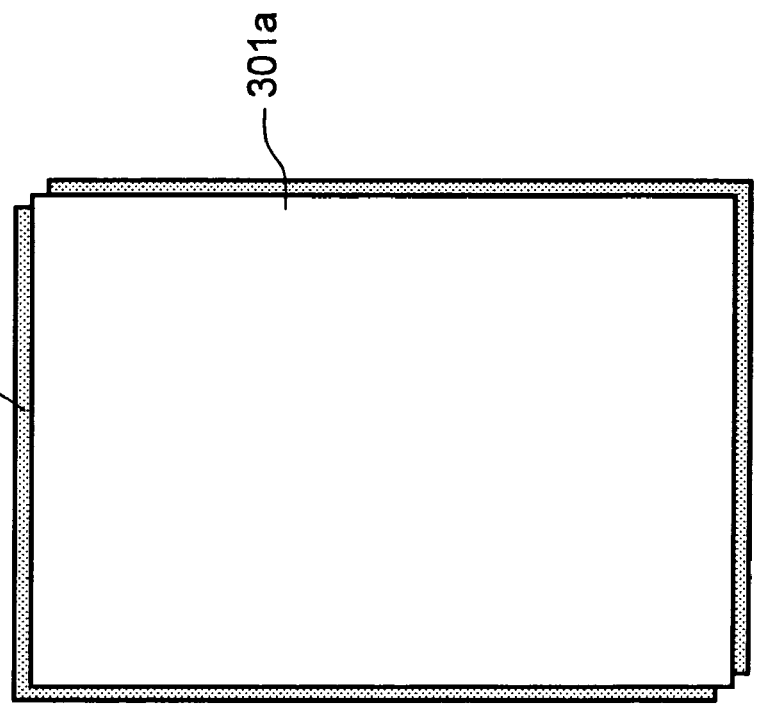

Next, the layout structure for one DUT is explained hereinafter with reference to FIGS. 6A and 6B. FIGS. 6A and 6B are planar layout diagrams of a DUT. As shown in FIG. 6A, L-shaped lines 302 are diagonally arranged along the periphery of a large-sized DUT 301a. Note that a small-sized DUT 301b can be also arranged by disposing extended line portions 303 as parts of L-shaped lines 304 as shown in FIG. 6B. That is, various DUTs having different sizes can be arranged by providing extended line portions 303. Furthermore, the DUT 301b has a square shape. By using a square shape, measurement can be also carried out in a state where the DUT is rotated by 90°.

Next, the structure of the L-shaped line 304 shown in FIG. 6B is explained hereinafter in detail with reference to FIGS. 7A to 7C. FIG. 7A is a planar layout diagram of L-shaped lines 304. As shown in FIG. 7A, the L-shaped lines 304 are composed of a source line 304s, a drain line 304d, a gate line 304g, and a back-gate line 304b.

Note that the source line 304s and the drain line 304d are formed from the same conductive layer, and the gate line 304g and the back-gate line 304b are also formed from the same conductive layer. However, the above-mentioned two conductive layers are different layers. That is, the L-shaped lines 304 have a two-layer structure. Although the drain line 304d and the gate line 304g are illustrated so as not to overlap with each other in FIG. 7A for the sake of convenience, their formation areas actually overlap with each other when viewed in the normal direction to the substrate. The same holds true for the source line 304s and the back-gate line 304b.

FIGS. 7B and 7C are plane views of a square DUT 301b. Furthermore, FIGS. 7B and 7C show the identical views of the DUT 301b except that the figure is rotated by 90° in FIG. 7C. As shown in FIG. 7B, the square DUT 301b, which is a MOS transistor, includes a source line 304s, a drain line 304d, a gate like 304g, a back-gate line 304b, a gate electrode 305, a drain region 306, a source region 307, and contacts 308. The source line 304s, the drain line 304d, the gate like 304g, and the back-gate line 304b are connected to the source region 307, the drain region 306, the gate electrode 305, and the substrate, respectively, through the contacts.

Note that by overlapping the square DUT 301b shown in FIG. 7B with the layout of the L-shaped lines 304 shown in FIG. 7A, the drain line 304d, the gate line 304g, and the back-gate line 304b of the DUT 301b can be connected to those of the L-shaped lines 304. Furthermore, since the L-shaped lines 304 have L-shapes, the drain line 304d, the gate line 304g, and the back-gate line 304b of the DUT 301b shown in FIG. 7C can be also connected to those of the L-shaped line 304 by overlapping the DUT 301b shown in FIG. 7C with the layout of the L-shaped lines 304 shown in FIG. 7A.

By forming a DUT in a square shape and arranging lines on the periphery of the DUT in L-shapes in the manner described above, measurement can be carried out even when the DUT is rotated by 90°. Furthermore, it is also possible to save the space by configuring the L-shaped lines in a two-layer structure.

Figure 8:
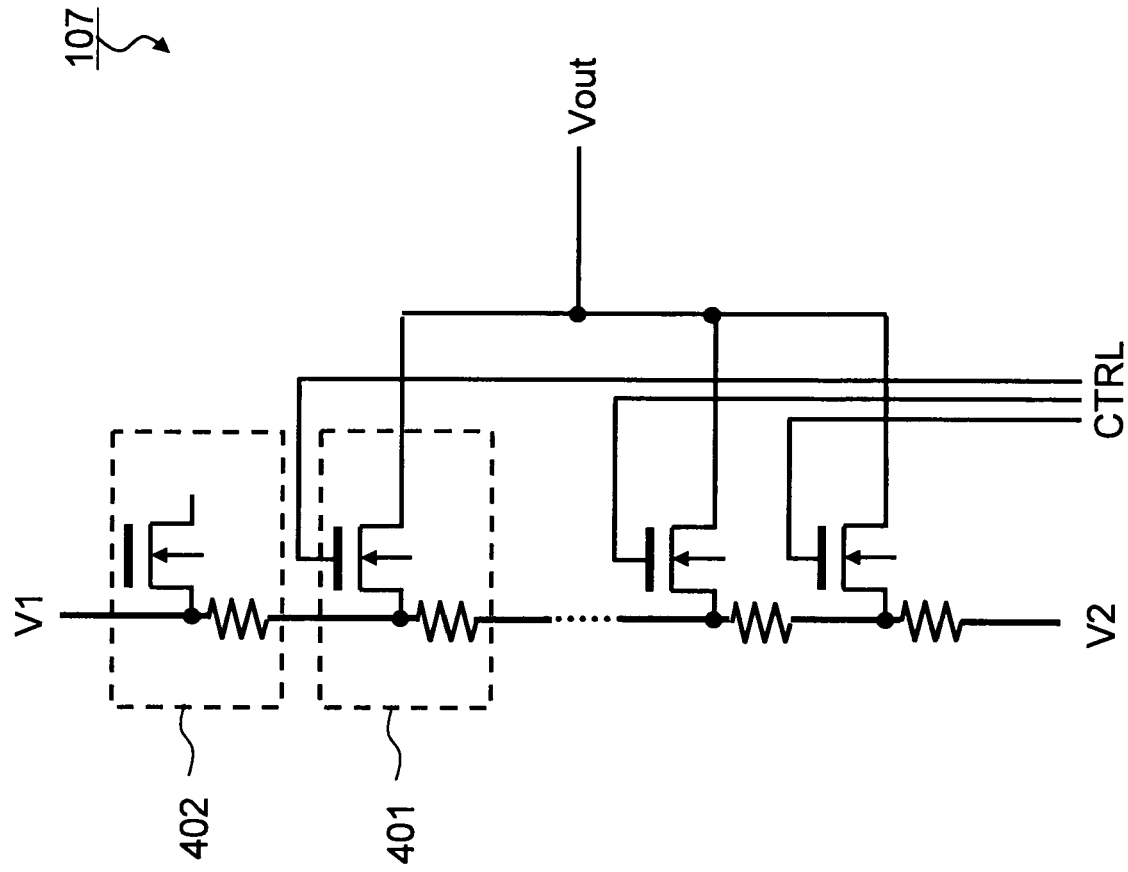
FIG. 8 is a circuit diagram illustrating the internal structure of a DAC.

Next, the structure of the DAC for X-address 107a and the DAC for Y-address 107b shown in FIG. 1 is explained hereinafter in detail with reference to FIG. 8. The above-mentioned two DACs have similar structures. Therefore, FIG. 8 shows the structure of a DAC 107 that can be used for both DACs. In a DAC in accordance with an exemplary embodiment of the present invention, unit cells 401, each of which is composed of one resistor and one NMOS transistor for a switch, are connected in series between a high potential V1 and a low potential V2. That is, it is a resistor string type DAC.

As shown in FIG. 8, a control potential CTRL is supplied to the gate of each of the transistors for switches. That is, a potential from V2 to V1 is output as Vout according to address signals XADR and YADR shown in FIG. 1. Note that the same potential as the SW control potential shown in FIG. 4, i.e., 3.3V is supplied as V1 in an exemplary embodiment of the present invention. Meanwhile, the same potential as the substrate potential shown in FIG. 4, i.e., −0.3V is supplied as V2. Needless to say, they are not limited to these values.

Furthermore, if it is used for a DAC for X-address 107a as shown in FIG. 1, the same signal as the X-address signal XADR input to the X-switch 104 is input as the control signal CTRL. Similarly, if it is used as a DAC for Y-address 107b, the same signal as the Y-address signal YADR input to the Y-switch 105 is input as the control signal CTRL.

Note that by conforming the polarity, i.e., the conductive type of the transistor for the switch constituting the DAC to those of the transistors of the X-switch 104 and Y-switch 105, exactly the same signal can be used as input without requiring any logical inversion. In an exemplary embodiment of the present invention, this is realized by using NMOS transistors for all of them. Needless to say, it may be also realized by using PMOS transistors.

Furthermore, in the case where an NMOS transistor is used as a transistor for a switch, when the potential between its drain and source become too high, the switch ceases to turn on. Therefore, a dummy cell 402 is provided on the high voltage side of the serially connected cells in an exemplary embodiment of the present invention. In this way, it is possible to use only the transistors that operates normally as the switches. In the case where PMOS transistors are used as the transistors for switches, a dummy cell 402 may be provided on the low voltage side. Note that the transistor may be omitted, leaving only the resistor in the dummy cell 402.

Second Exemplary Embodiment

Figure 9:
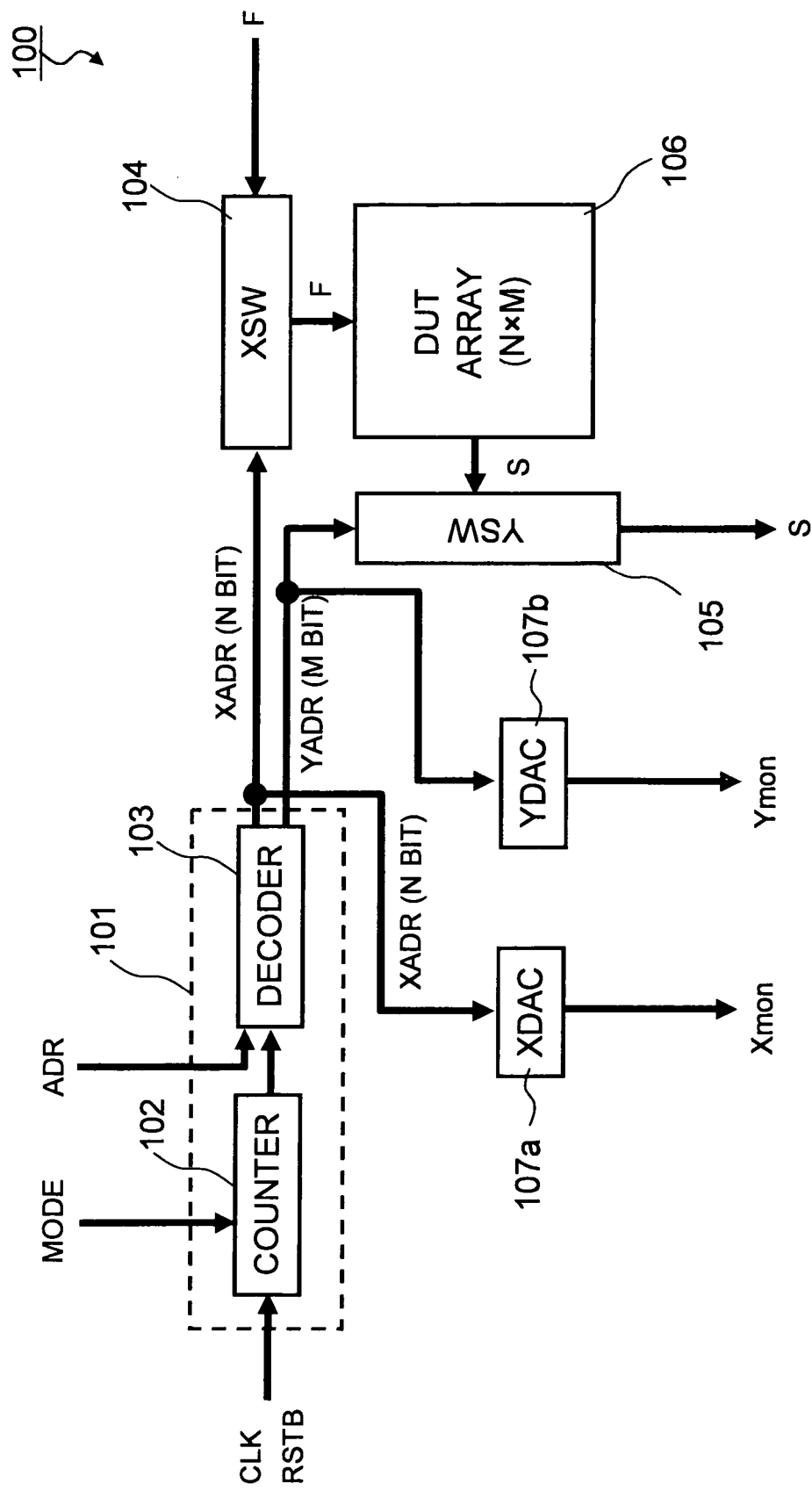
FIG. 9 is a block diagram of a TEG in a semiconductor device in accordance with another exemplary embodiment of the present invention.

Next, another embodiment is explained hereinafter. FIG. 9 is a block diagram of a semiconductor device in accordance with another exemplary embodiment of the present invention. The same signs are assigned to the same components as the previous exemplary embodiment, and explanation of them are omitted as appropriate.

In a TEG 100 in accordance with this exemplary embodiment, it is possible to bring the output of the counter 102 to a high-impedance state by inputting a mode signal MODE to the counter 102. In this way, it is possible to input an external address signal ADR to the decoder 103 from the outside of the circuit. The other structures are similar to those of the previous exemplary embodiment.

Specifically, in the past, even when it is desired that measurement is carried out again for only the DUT that exhibits an abnormal value, the measurement needs to be carried out for all the DUTs in the DUT array 106. As has been explained above in the previous exemplary embodiment, it is possible to recognize the address of a DUT within the DUT array 106 by the DAC for X-address 107a and the DAC for Y-address 107b in one aspect of the present invention. That is, it is possible to know specifically which DUT exhibits the abnormal value. Furthermore, by using a technique in accordance with this exemplary embodiment of the present invention, it is possible to designate the address only for the DUT that exhibits the abnormal value. Therefore, the measuring time may be significantly reduced.

Third Exemplary Embodiment

Figure 10:
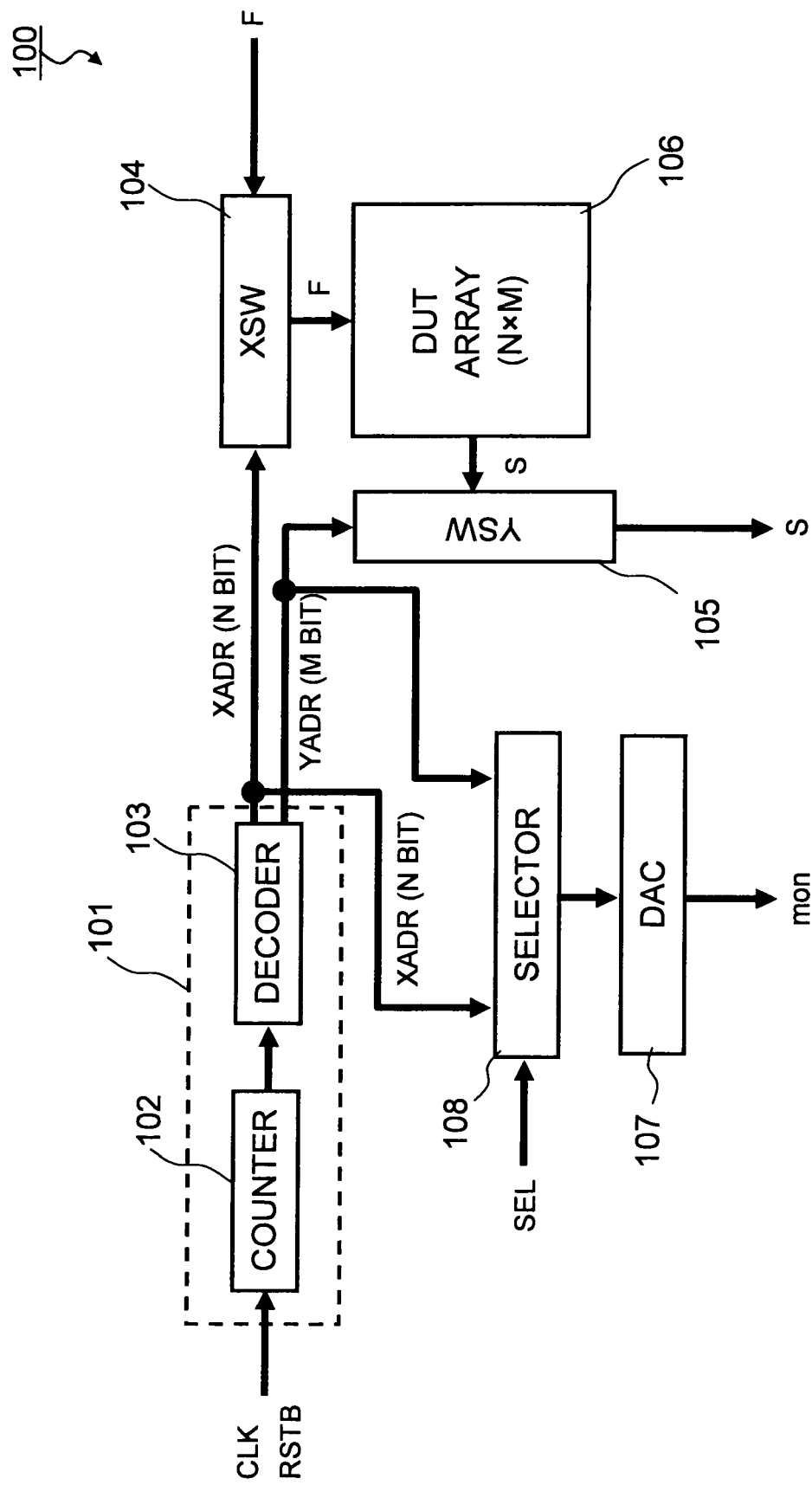
FIG. 10 is a block diagram of a TEG in a semiconductor device in accordance with another exemplary embodiment of the present invention.

Next, another embodiment is explained hereinafter. FIG. 10 is a block diagram of a semiconductor device in accordance with another exemplary embodiment of the present invention. The same signs are assigned to the same components as the firstly-explained exemplary embodiment, and explanation of them are omitted as appropriate.

A TEG 100 in accordance with this exemplary embodiment includes a selector 108 and a single DAC 107, instead of the DAC for X-address 107a and the DAC for Y-address 107b in the firstly-explained exemplary embodiment. One of the X-address signal XADR and the Y-address signal YADR, both of which are output from the decoder 103, is selected based on a select signal SEL input to the selector 108. The selected address signal is input to the DAC 107. The other structures are similar to those of the firstly-explained exemplary embodiment.

This exemplary embodiment has an advantage that only one DAC 107 should be mounted with the provision of the selector 108. Furthermore, in the case where the address is divided into and output from the decoder 103 in more than two address signals rather than in the two address signals, i.e., the X-address signal XADR and the Y-address signal YADR, the number of terminals can be reduced in comparison to the case where the same number of DACs as the number of the address signals are provided.

Fourth Exemplary Embodiment

Figure 11:
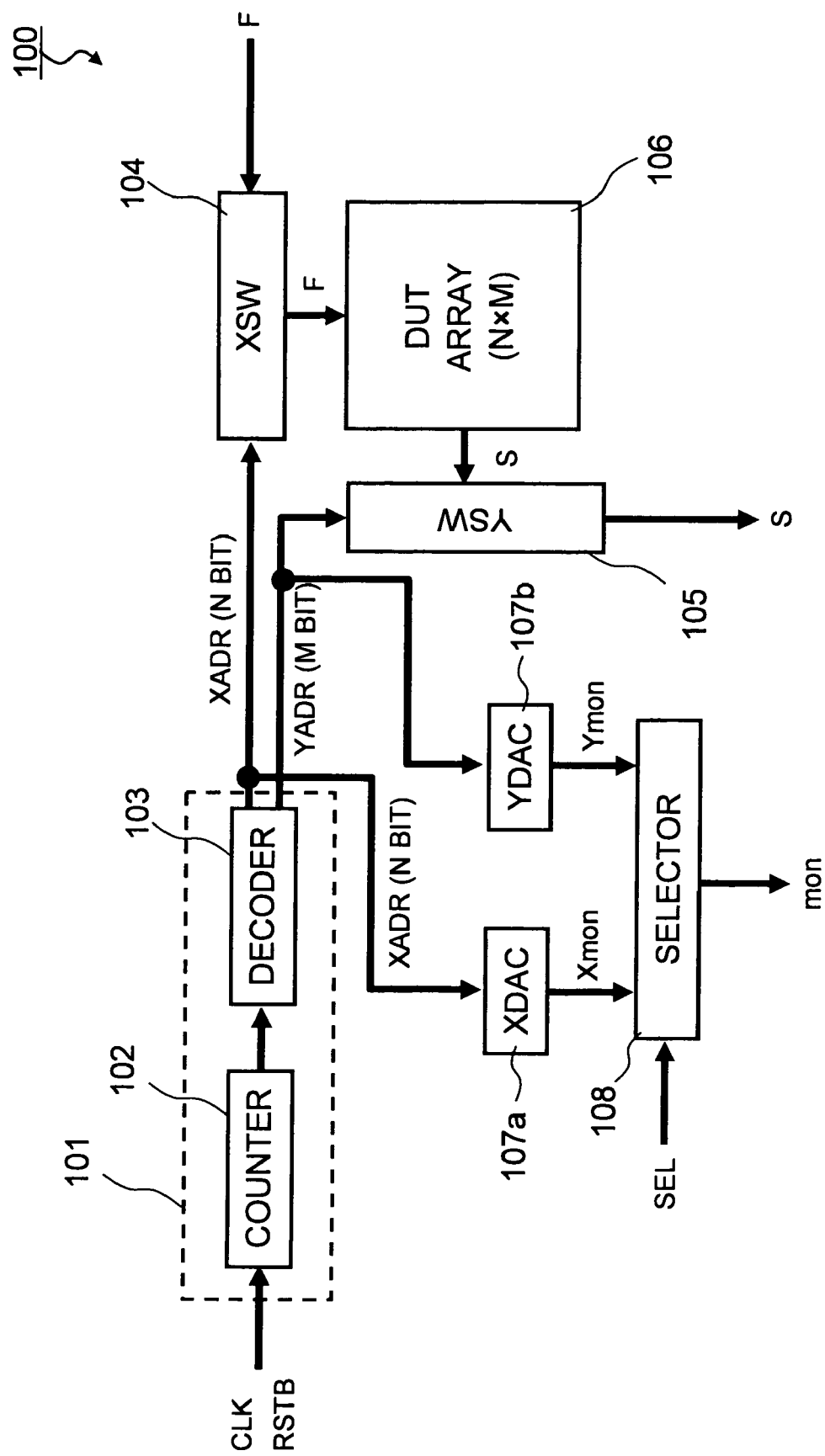
FIG. 11 is a block diagram of a TEG in a semiconductor device in accordance with another exemplary embodiment of the present invention.

Next, another embodiment is explained hereinafter. FIG. 11 is a block diagram of a semiconductor device in accordance with another exemplary embodiment of the present invention. The same signs are assigned to the same components as the firstly-explained exemplary embodiment, and explanation of them are omitted as appropriate.

A TEG 100 in accordance with this exemplary embodiment has an additional selector 108 in comparison to the firstly-explained exemplary embodiment. Specifically, the selector 108 selects one of signals Xmon and Ymon output from the DAC for X-address 107a and the DAC for Y-address 107b based on a select signal SEL input to the selector 108. The selected signal "mon" is detected in the wafer testing device 200. The other structures are similar to those of the firstly-explained exemplary embodiment.

In the case where the address is divided into and output from the decoder 103 in more than two address signals rather than in the two address signals, i.e., the X-address signal XADR and the Y-address signal YADR, this exemplary embodiment can reduce the number of terminals with the provision of the selector 108 in comparison to the case where the same number of DACs as the number of the address signals are provided.

Fifth Exemplary Embodiment

Figure 12:
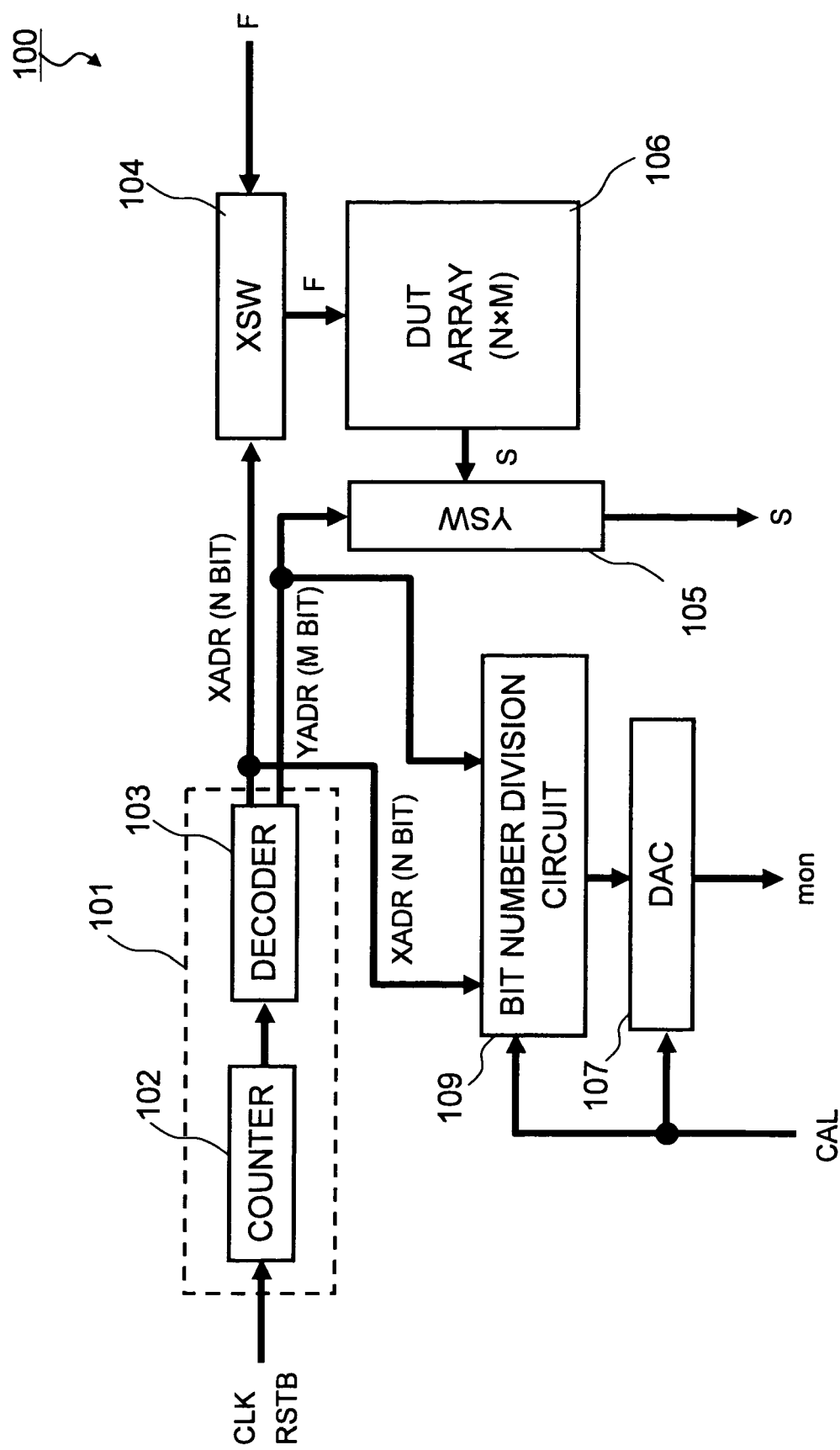
FIG. 12 is a block diagram of a TEG in a semiconductor device in accordance with another exemplary embodiment of the present invention.
Figure 13:
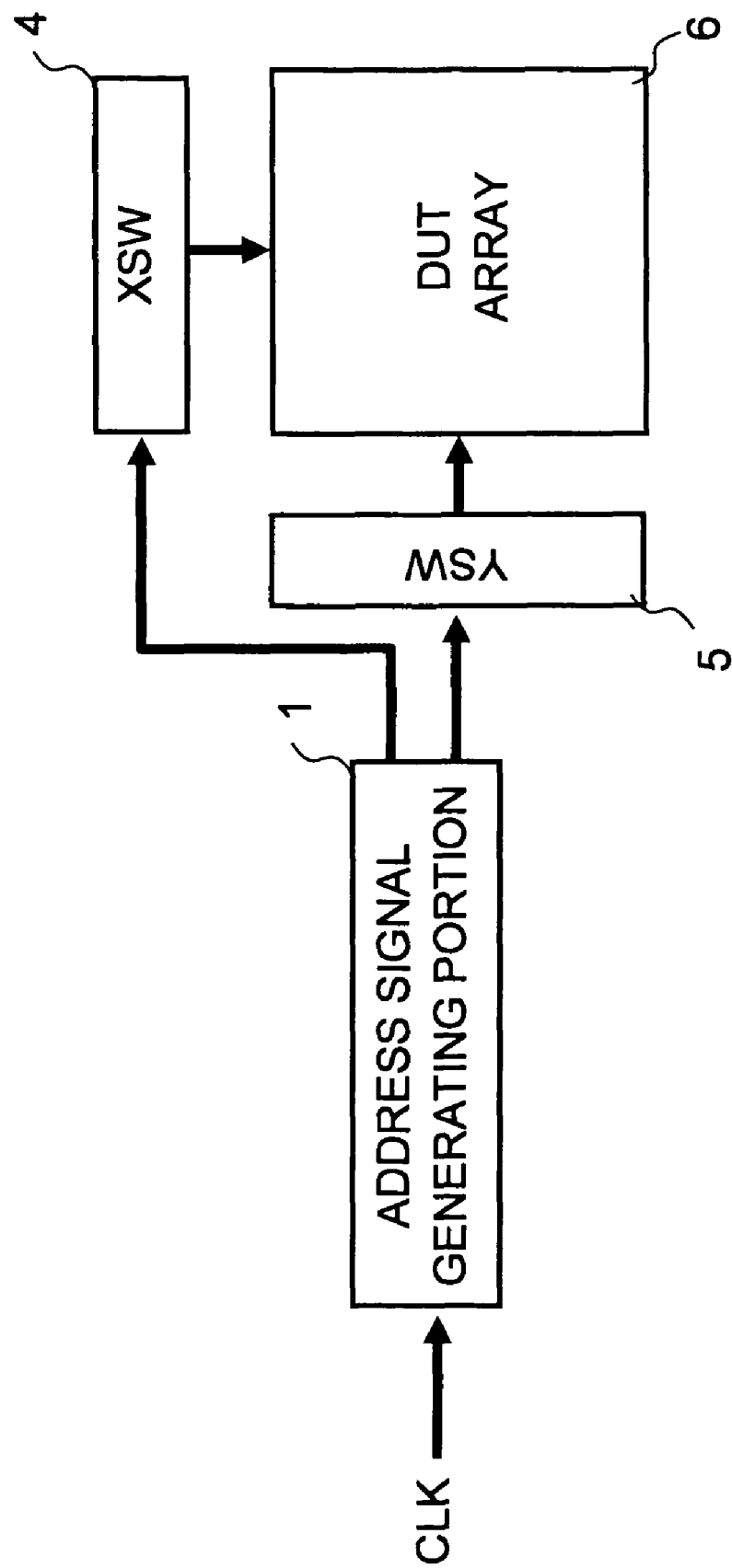
FIG. 13 is a figure for illustrating a problem to be solved by the present invention.

Next, another embodiment is explained hereinafter. FIG. 12 is a block diagram of a semiconductor device in accordance with another exemplary embodiment of the present invention. The same signs are assigned to the same components as the firstly-explained exemplary embodiment, and explanation of them are omitted as appropriate.

A TEG 100 in accordance with this exemplary embodiment includes a bit number division circuit 109 and a single DAC 107, instead of the DAC for X-address 107a and the DAC for Y-address 107b in the firstly-explained exemplary embodiment. One of the X-address signal XADR and the Y-address signal YADR, both of which are output from the decoder 103, is selected based on a calibration signal CAL input to the bit number division circuit 109. Furthermore, its bit number is divided until the address signal becomes a signal "mon" that can be measured in the wafer testing device 200. The divided address signal is input to the DAC 107. The number of steps of the DAC 107 is also determined based on the calibration signal CAL. Then, a signal "mon" output from the DAC 107 is detected in the wafer testing device 200. The calibration signal CAL is generated by the wafer testing device 200 based on the decision whether this signal "mon" is measurable or not. That is, a feedback control is carried out by the wafer testing device 200. The other structures are similar to those of the firstly-explained exemplary embodiment.

In this exemplary embodiment of the present invention, it is possible to divide the bit numbers of the X-address signal XADR and the Y-address signal YADR with the provision of the bit number division circuit 109. Therefore, there is an advantage that only one small DAC 107 should be mounted even when the bit numbers of the X-address signal XADR and the Y-address signal YADR are large. Furthermore, the optimal number of steps for the DAC can be selected during the measurement based on the measurement accuracy of the wafer testing device 200.

The above exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device, comprising:
a plurality of test elements formed in an array on a semiconductor substrate;
an address signal generating portion that generates an address signal corresponding to each of the test elements;
a digital-to-analog converter that receives the address signal other than through the plurality of test elements and converts the address signal into an analog signal and outputs the converted analog signal;
wherein the address signal comprises an X-coordinate address signal and a Y-coordinate address signal;
an X-coordinate switch that switches according to the X-coordinate address signal, and a Y-coordinate switch that switches according to the Y-coordinate address signal;
wherein the digital-to-analog converter comprises a resistor string type digital-to-analog converter; and
wherein a conductive type of transistors constituting the digital-to-analog converter is a same conductive type as a conductive type of transistors constituting the X-coordinate switch and the Y-coordinate switch.

2. The semiconductor device according to claim 1, wherein the address signal comprises a plurality of address signals, and
wherein the semiconductor device further comprises a plurality of digital-to-analog converters, each of which converts a corresponding one of the plurality of address signals into an analog signal and outputs a corresponding converted analog signal.

3. The semiconductor device according to claim 1, wherein the address signal comprises a plurality of address signals,
wherein the semiconductor device further comprises a selector that selects one of the plurality of address signals, and
wherein the semiconductor device comprises the one digital-to-analog converter that converts the selected one address signal to an analog signal and outputs the converted analog signal.

4. The semiconductor device according to claim 1, wherein the address signal generating portion comprises a counter and a decoder.

5. The semiconductor device according to claim 4, wherein any given address signal can be input to the decoder.

6. The semiconductor device according to claim 1, wherein a deep N-well is formed in an area other than the area where the test element is formed, and no deep N-well is formed in the area where the test element is formed.

7. The semiconductor device according to claim 1, wherein the digital-to-analog converter receives the address signal directly from the address signal generating portion.

8. The semiconductor device according to claim 1, wherein the digital-to-analog converter receives the address signal from the address signal generating portion.

9. A semiconductor device, comprising:
a plurality of test elements formed in an array on a semiconductor substrate;
an address signal generating portion that generates an address signal corresponding to each of the test elements;
a digital-to-analog converter that converts the address signal into an analog signal and outputs the converted analog signal as an X-address signal and a Y-address signal;
a plurality of X-coordinate switches formed in the semiconductor substrate to designate an X-axis direction in the plurality of test elements based on the X-address signal; and
a plurality of Y-coordinate switches formed in the semiconductor substrate to designate a Y-axis direction in the plurality of test elements based on the Y-address signal,
wherein a conductive type of transistors constituting the digital-to-analog converter is a same conductive type as a conductive type of transistors constituting the plurality of X-coordinate switches and the plurality of Y-coordinate switches.

10. The semiconductor device according to claim 9, wherein the address signal generating portion comprises:
a counter to generate a count value; and
a decoder associated with the counter to generate an X-address signal and a Y-address signal based on the count value.

11. The semiconductor device according to claim 9, wherein the individual test elements of the plurality of test elements are arranged in an X-direction and a Y-direction on the semiconductor substrate.

12. The semiconductor device according to claim 11, wherein a respective one of the plurality of test elements comprises a transistor.

13. The semiconductor device according to claim 9, wherein a substrate potential of the plurality of X-coordinate switches and a substrate potential of the plurality of Y-coordinate switches arc isolated from a substrate potential of the plurality of test elements.

14. The semiconductor device according to claim 9, further comprising a deep N-well formed in a peripheral circuit area of the plurality of test circuit,
wherein the plurality of X-coordinate switches and the plurality of Y-coordinate switches are formed in the peripheral area of the test circuit.

15. The semiconductor device according to claim 9, further comprising a deep N-well formed below the plurality of X-switches and the plurality of Y-switches.

* * * * *

UNITED STATES PATENT AND TRADEMARK OFFICE
CERTIFICATE OF CORRECTION

| | | |
|---|---|---|
| PATENT NO. | : 7,986,156 B2 | Page 1 of 1 |
| APPLICATION NO. | : 12/379773 | |
| DATED | : July 26, 2011 | |
| INVENTOR(S) | : Jun Ikeda | |

It is certified that error appears in the above-identified patent and that said Letters Patent is hereby corrected as shown below:

On the Title Page in the title (54), replace "PROTION" with "PORTION"

Signed and Sealed this
Twenty-seventh Day of September, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,986,156 B2 | Page 1 of 1 |
| APPLICATION NO. | : 12/379773 | |
| DATED | : July 26, 2011 | |
| INVENTOR(S) | : Jun Ikeda et al. | |

It is certified that error appears in the above-identified patent and that said Letters Patent is hereby corrected as shown below:

On the Title Page in the title (54) and at Column 1, line 2, replace "PROTION" with "PORTION"

This certificate supersedes the Certificate of Correction issued September 27, 2011.

Signed and Sealed this
Twenty-fifth Day of October, 2011

David J. Kappos
*Director of the United States Patent and Trademark Office*